US006939728B2

(12) United States Patent
Sheng et al.

(10) Patent No.: US 6,939,728 B2
(45) Date of Patent: Sep. 6, 2005

(54) METHOD OF FABRICATING SILICON EMITTER WITH A LOW POROSITY HEAVILY DOPED CONTACT LAYER

(75) Inventors: Xia Sheng, Los Altos, CA (US); Nobuyoshi Koshida, Tokyo (JP); Huei-Pei Kuo, Cupertino, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 107 days.

(21) Appl. No.: 10/439,642

(22) Filed: May 15, 2003

(65) Prior Publication Data

US 2004/0031955 A1 Feb. 19, 2004

Related U.S. Application Data

(62) Division of application No. 09/845,845, filed on Apr. 30, 2001, now Pat. No. 6,771,010.

(51) Int. Cl.[7] .................................................. H10L 21/00

(52) U.S. Cl. ............................. 438/20; 438/22; 438/45; 438/47; 438/380; 438/570; 438/960; 257/10; 257/103; 257/591; 445/46

(58) Field of Search .............................. 438/20, 22, 45, 438/47, 380, 570, 960; 257/10, 103, 591; 445/46

(56) References Cited

U.S. PATENT DOCUMENTS 5,990,605 A * 11/1999 Yoshikawa et al. ......... 313/310
6,249,080 B1 * 6/2001 Komoda et al. ............ 313/310

* cited by examiner

*Primary Examiner*—Tom Thomas
*Assistant Examiner*—Matthew E. Warren
(74) *Attorney, Agent, or Firm*—Trueman H. Denny, III

(57) ABSTRACT

A high emission electron emitter and a method of fabricating a high emission electron emitter are disclosed. A high emission electron emitter includes an electron injection layer, an active layer of high porosity porous silicon material in contact with the electron injection layer, a contact layer of low porosity porous silicon material in contact with the active layer and including an interface surface with a heavily doped region, and an optional top electrode in contact with the contact layer. The contact layer reduces contact resistance between the active layer and the top electrode and the heavily doped region reduces resistivity of the contact layer thereby increasing electron emission efficiency and stable electron emission from the top electrode. The electron injection layer is made from an electrically conductive material such as n+ semiconductor, n+ single crystal silicon, a metal, a silicide, or a nitride. The active layer and the contact layer are formed in a layer of silicon material that is deposited on the electron injection layer and then electrochemically anodized in a hydrofluoric acid solution. Prior to the anodization, the interface surface can be doped to form the heavily doped region. The layer of silicon material can be porous epitaxial silicon, porous polysilicon, porous amorphous silicon, and porous silicon carbide.

25 Claims, 5 Drawing Sheets

METHOD OF FABRICATING SILICON EMITTER WITH A LOW POROSITY HEAVILY DOPED CONTACT LAYER

CROSS RELATED TO RELATED APPLICATIONS

This is a divisional of application Ser. No. 09/845,845 filed on Apr. 30, 2001 U.S. Pat. No. 6,771,010 which is hereby incorporated by reference herein.

FIELD OF THE INVENTION

The present invention relates generally to a silicon emitter with a contact layer of low porosity porous silicon material including a heavily doped region and to a method of fabricating a silicon emitter with a contact layer of low porosity porous silicon material including a doped region. More specifically, the present invention relates to a silicon emitter including a contact layer of low porosity porous silicon material including a heavily doped region for reducing contact resistance between an active layer of high porosity porous silicon material and a top electrode and for increasing electron emission efficiency and emission stability of the top electrode and to a method of fabricating the same.

BACKGROUND ART

FIG. 1 illustrates a prior porous silicon emitter 100. The prior porous silicon emitter 100 is a diode structure that includes a heavily doped n+ silicon (Si) substrate 103 that serves as an electron injection layer, an optional ohmic contact 105 in electrical contact with the substrate 103, an active porous silicon (Si) layer 101 formed on the substrate 103, and an electrode 107 formed on the active porous silicon layer 101 and in electrical communication with the electrode 107. When the electrode 107 is biased positively relative to the substrate 103, a diode current $I_d$, supplied by a voltage source $V_1$, passes through the active layer 101 and the substrate 103. A fraction of the diode current $I_\theta$, is injected into a vacuum region (not shown) above the electrode 107 and is collected by a collector electrode 115 that is positioned opposite the electrode 107. The collector electrode 115 is biased positively relative to the electrode 107 by a voltage source $V_2$ to extract electrons e− that are emitted by the electrode 107. The electrodes (107, 115) and the ohmic contact 105 can be made from an electrically conductive material such as gold (Au) or aluminum (Al).

One disadvantage of the prior porous silicon emitter 100 is that the active porous silicon (Si) layer 101 has a high porosity that results in a high series contact resistance $R_C$ between the electrode 107 and the active porous silicon (Si) layer 101. The resistance $R_c$ is comparable with or even larger than the resistance of the active porous silicon (Si) layer 101 at high voltage. Consequently, the high series contact resistance $R_c$ creates an undesirable/unintentional voltage drop between the active layer 101 and the electrode 107 that reduces an electron emission efficiency of the porous silicon emitter 100.

Moreover, the high series contact resistance $R_c$ results in a higher power consumption and higher power dissipation (waste heat). This tends to reduce the useful life time of the emitter 100. In battery powered applications it is desirable to reduce power consumption so that battery life and operating time are extended. Furthermore, it is desirable to reduce the amount of waste heat generated by a system because thermal management systems such as fans and heat sinks add to system cost, weight, and complexity.

A second disadvantage of the prior porous silicon emitter 100 is that the contact resistance $R_c$ causes the diode and emission current to saturate at high bias voltages supplied by $V_1$. It is desirable to have the electron emission current increase with increasing voltage levels. However, if saturation occurs the electron emission current peaks and does not increase with increasing voltage.

Finally, another disadvantage of the prior porous silicon emitter 100 is that the active porous silicon (Si) layer 101 has a high contact resistance with the electrode 107 that results in a reduction in electron emission efficiency.

Therefore, there exists a need for a porous silicon emitter that reduces the series contact resistance between an active porous silicon layer and an electrode of the porous silicon emitter. There is also a need for a porous silicon emitter that can operate at lower voltages thereby reducing power consumption and generation of waste heat. Furthermore there is a need for a porous silicon emitter that does not saturate at higher voltages so that high emission currents and efficiency are obtainable at those higher voltages.

SUMMARY OF THE INVENTION

The present invention solves the aforementioned problems created by the high series contact resistance by including a contact layer of low porosity and low resistivity porous silicon material between an active layer of high porosity porous silicon material and a top electrode. Furthermore, a portion of the contact layer of low porosity porous silicon that is adjacent to the top electrode includes a heavily doped region resulting in an increased electron emission efficiency and emission current from the top electrode and a further reduction of the operating voltage. The contact layer of low porosity porous silicon reduces the series contact resistance between the top electrode and the active layer of high porosity porous silicon. As a result, when a bias voltage is applied to the diode, the voltage drop between the active layer and the top electrode is reduced, and most of the voltage drop is produced in the active layer.

Additionally, the aforementioned problems associated with high power consumption and high power dissipation of the prior porous silicon emitter are solved by the contact layer of low porosity porous of the present invention because the reduced contact resistance results in reduced power consumption and reduced power dissipation. Furthermore, the reduced contact resistance allows for operation of the electron emitter at reduced voltage levels that are commensurate with the goals of low power consumption and low power dissipation.

Broadly, the present invention is embodied in a high emission electron emitter and a method of fabricating a high emission electron emitter. A high emission electron emitter according to the present invention includes an electron injection layer, an active layer of high porosity porous silicon material in contact with the electron injection layer, a contact layer of low porosity porous silicon material in contact with the active layer and including a heavily doped region that extends inward of an interface surface of the contact layer, and a top electrode in contact with the interface surface of the contact layer. The contact layer with the heavily doped region reduces contact resistance between the active layer and the top electrode. The doped region reduces the resistivity of the contact layer. The electron injection layer is made from an electrically conductive material such as an n+ semiconductor, n+ single crystal silicon (Si), a silicide, a metal, or a layer of metal on a glass substrate. The active layer and the contact layer can be formed in an epitaxial layer of silicon (Si), a polysilicon layer of silicon (Si), a layer of amorphous silicon (Si), or a layer of silicon carbide (SiC) that is deposited on the electron injection layer. The top electrode is an electrically conductive material such as gold (Au) or aluminum (Al).

A method of fabricating a high emission electron emitter includes doping an interface surface of a layer of silicon material with a n+ dopant, annealing the layer of silicon material to form a doped region that extends inward of an interface surface of the layer of silicon material, electrochemically anodizing the interface surface in a hydrofluoric acid (HF) solution in either one of a dark ambient or an illuminated ambient at a first anodization current density to form a contact layer of low porosity porous silicon material. The first anodization current density is maintained for a first period of time until the contact layer has reached a first thickness. Next, the first anodization current density is increased to a second anodization current density (i.e. the second anodization current density is greater than or equal to the first anodization current density) to form an active layer of high porosity porous silicon material. The second anodization current density is maintained for a second period of time until the active layer has reached a second thickness. Finally, an optional top electrode can be deposited on the interface surface.

In one embodiment of the present invention, the electron injection layer comprises a material including but not limited to a n+ semiconductor, n+ single crystal silicon, a metal, metallic alloys, a layer of metal on a glass substrate, and silicides of metal.

In another embodiment of the present invention, the contact layer of low porosity porous silicon material and the active layer of high porosity porous silicon material can be a material including but not limited to porous epitaxial silicon, porous polysilicon, and porous silicon carbide.

In alternative embodiments of the present invention, the porous epitaxial silicon can be: intrinsic porous epitaxial silicon; n− porous epitaxial silicon; or p− porous epitaxial silicon. The porous polysilicon can be: intrinsic porous polysilicon; n− porous polysilicon; or p− porous polysilicon.

In yet another embodiment of the present invention, the n+ doped region is doped using a process including but not limited to ion implantation, diffusion, and insitu deposition. The heavily doped region can include but is not limited to n-type dopants such as arsenic, antimony, phosphorus, vanadium, and nitrogen.

In one embodiment of the present invention, the electron injection layer includes an ohmic contact.

Other aspects and advantages of the present invention will become apparent from the following detailed description, taken in conjunction with the accompanying drawings, illustrating by way of example the principles of the present invention.

DETAILED DESCRIPTION

Figure 1:
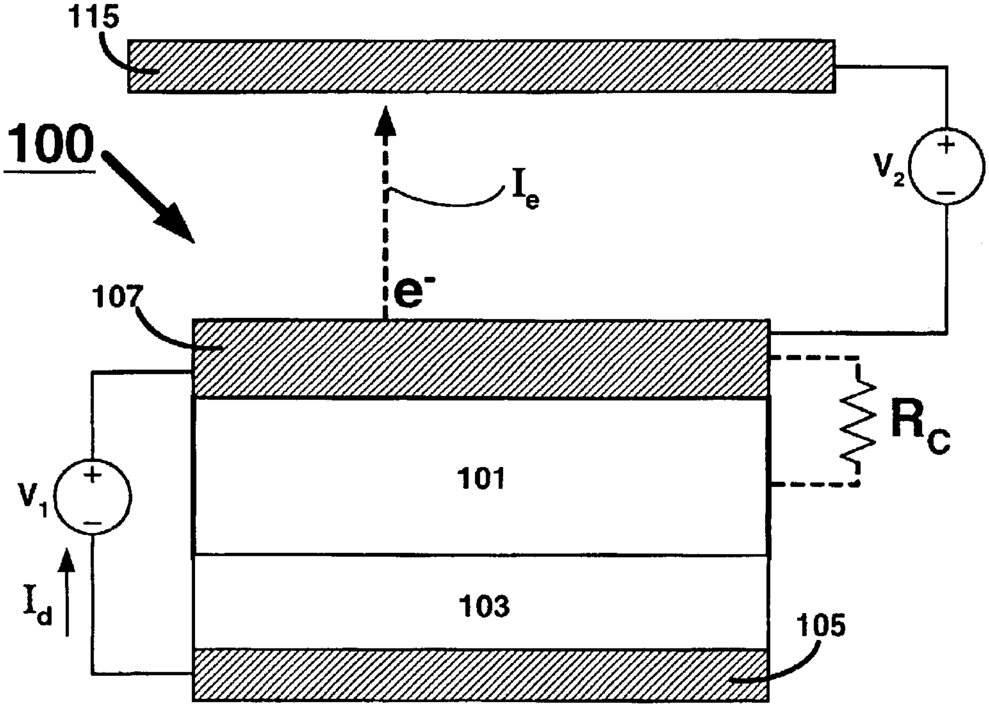
FIG. 1 (Prior Art)
FIG. 1 is a cross-sectional view of a prior porous silicon emitter with a high porosity porous silicon active layer.

In the following detailed description and in the several figures of the drawings, like elements are identified with like reference numerals.

As shown in the drawings for purpose of illustration, the present invention is embodied in a high emission electron emitter with a contact layer of low porosity porous silicon material that includes a heavily doped region and a method of fabricating a high emission electron emitter with a contact layer of low porosity porous silicon that includes a doped region.

A high emission electron emitter includes an electron injection layer, an active layer of high porosity porous silicon material in contact with the electron injection layer, a contact layer of low porosity porous silicon material in contact with the active layer, a heavily doped region extending inward of an interface surface of the contact layer, and a top electrode in contact with interface surface. The contact layer of low porosity porous silicon material reduces contact resistance (i.e. the contact resistance is lower) between the active layer of high porosity porous silicon material and the top electrode. Moreover, the heavily doped region further reduces the resistivity of the contact layer of low porosity porous silicon material resulting in increased electron emission current from the top electrode and stable electron emission from the top electrode. Consequently, when the high emission electron emitter is biased to emit electrons from the top electrode at a certain voltage, the operating voltage is reduced.

Advantages of the reduced contact resistance include reduced power consumption, reduced power dissipation, high emission currents at higher operating voltages without current saturation, and reduced operating voltages.

Figure 2A:
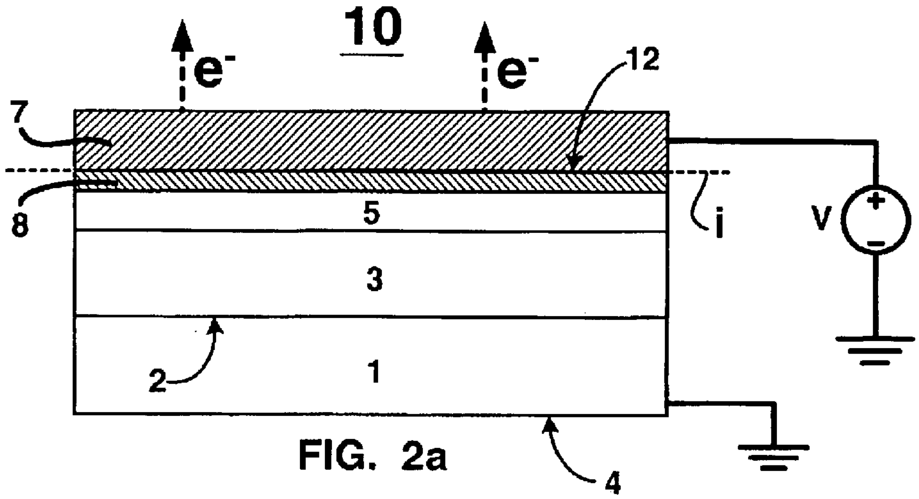
FIG. 2*a* is a cross-sectional view of a high emission electron emitter with a contact layer of low porosity porous silicon material and a n+ doped region according to the present invention.

In FIG. 2*a*, a high emission electron emitter 10 includes an electron injection layer 1 including a front-side surface 2 and a back-side surface 4, an active layer of high porosity porous silicon material 3 in contact with the electron injection layer 1, a contact layer of low porosity porous silicon material 5 in contact with the active layer of high porosity porous silicon 3 and including a heavily doped region 8 (doped region 8 hereinafter) that extends inward of an interface surface 12 of the contact layer 5, and a top electrode 7 in contact with the interface surface 12 of the contact layer of low porosity porous silicon material 5.

The high emission electron emitter 10 emits electrons e− from the top electrode 7 (see dashed line) when the top electrode 7 is biased positively relative to the electron injection layer 1 by an external voltage source V. Although only one external voltage source V is shown, more than one voltage source can be used to bias the top electrode 7 and the electron injection layer 1 relative to each other. In FIG. 2*a*, the electron injection layer 1 is connected to ground and the top electrode 7 is connected to a positive terminal of the external voltage source V.

The contact layer 5 and the active layer 3 are formed in a layer of silicon material 6 (see dashed lines in FIG. 2*b*) that is deposited on the electron injection layer 1 as will be described in greater detail below.

The electron injection layer 1 can be made from an electrically conductive material including but not limited to those set forth in Table 1 below.

TABLE 1

| Materials for the electron injection layer 1 |
| --- |
| n+ Semiconductor |
| n+ Single Crystal Silicon |
| an Electrically Conductive Silicide |
| a Metal |
| a Layer of Metal on a Glass Substrate |
| an Electrically Conductive Nitride |

The n+ single crystal silicon and the n+ semiconductor can be in the form of a silicon wafer, a semiconductor wafer, or a substrate. The n+ single crystal silicon can have a crystalline orientation of (100) and (111). Other crystalline orientations can also be used. Preferably, the n+ single crystal silicon has a (100) crystalline orientation.

Suitable metals for the electron injection layer 1 include any electrically conductive metal. Gold (Au), a gold alloy, aluminum (Al), and an aluminum alloy are examples of suitable metals. Those metals are also suitable if the electron injection layer 1 is a layer of metal on a glass substrate. For instance, the electron injection layer 1 can be a layer of gold (Au) or aluminum (Al) having a thickness of about 0.10 μm to about 0.30 μm that is deposited on a glass substrate.

The electron injection layer 1 can be an electrically conductive silicide such as titanium silicide (TiSi) or platinum silicide (PtSi) or the electron injection layer 1 can be an electrically conductive nitride such as titanium nitride ($Ti_3N_4$), for example.

Figure 2B:
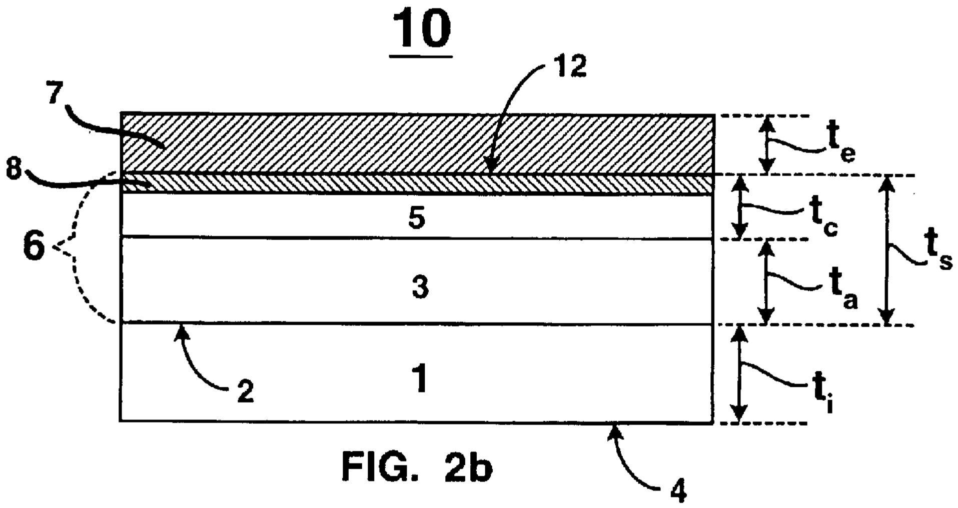
FIG. 2*b* is a cross-sectional view of the high emission electron emitter of FIG. 2*a* illustrating thicknesses of various layers according to the present invention.

In FIG. 2*b*, thicknesses for the various layers of the high emission electron emitter 10 are illustrated. Thicknesses for the layers illustrated herein can vary depending on the application and the present invention is not limited to the ranges of thicknesses set forth herein.

The electron injection layer 1 can have a thickness $t_i$ determined by the thickness of the material used. For instance, if a single crystal silicon wafer is used for the electron injection layer 1, then the thickness $t_i$ of the electron injection layer 1 will be that of the wafer. If the electron injection layer 1 is thinned by a process such as grinding, lapping, polishing, or chemical mechanical planarization, then the final thickness of the thinned electron injection layer 1 will be $t_i$. If a substrate other than a wafer is used, then $t_i$ will be the thickness of the substrate or the thickness of the substrate after any thinning process.

Typically, the top electrode 7 is a thin layer of an electrically conductive material including but not limited to gold (Au), a gold alloy, aluminum (Al), an aluminum alloy, tungsten (W), a tungsten alloy, platinum (Pt), and a platinum alloy. The top electrode 7 can also be a multilayer metal that includes two or more different metal materials. Preferably, a thin layer of gold (Au) or a gold alloy is used for the top electrode 7.

The top electrode 7 can have a thickness $t_e$ from about 5.0 nm to about 10 nm depending on the conductivity of the contact layer 5. If the conductivity of the contact layer 5 is high, the top electrode 7 can be thinner. Processes for depositing the top electrode 7 include but are not limited to e-beam evaporation, thermal evaporation, and sputtering, for example. The top electrode 7 is optional and is not necessary if the doped region 8 of the contact layer 5 is sufficiently conductive (i.e. a resistivity of ≈several mΩ.cm).

The active layer of high porosity porous silicon material 3 can have a thickness $t_a$ from about 0.5 μm to about 10.0 μm and the contact layer of low porosity porous silicon material 5 can have a thickness $t_c$ from about 10.0 nm to about 100.0 nm.

In FIG. 2*b*, the contact layer 5 and the active layer 3 are formed in a layer of silicon material 6 that is deposited on a front-side surface 2 of the electron injection layer 1. The active layer 3 is in contact with the electron injection layer 1 and is positioned between the contact layer 5 and the electron injection layer 1. A process such as low-pressure chemical vapor deposition (LPCVD) can be used to deposit the layer of silicon material 6, for example. The layer of silicon material 6 includes an interface surface 12 that will become an interface surface 12 of the contact layer 5 after the contact layer 5 is formed in the layer of silicon material 6 as will be discussed below.

The layer of silicon 6 has a thickness $t_s$ from about 0.5 μm to about 10.0 μm. The thickness $t_s$ closely approximates a thickness $t_a$ of the active layer of high porosity porous silicon material 3 (i.e. $t_s \cong t_a$) because a thickness $t_c$ of the contact layer of low porosity porous silicon material 5 is substantially thinner than the thickness $t_a$ (i.e. nm for $t_c$ versus μm for $t_a$, approximately a three order of magnitude difference in thickness). A thickness $t_d$ of the doped region 8 ($t_d \leqq t_c$), ranges from about 5 nm to about 50 nm.

After the formation of the contact layer 5 and the active layer 3, the top electrode 7 is deposited on the interface surface 12 of the contact layer 5. The doped region 8 extends inward of the interface surface and the top electrode 7 is in contact with a portion of the doped region 8 that is proximate to the interface surface 12 (see dashed line i in FIG. 2*a*). The doped region 8 reduces the resistivity (Ω.cm) of the contact layer 5.

The layer of silicon 6 can be made from a material including but not limited to the materials set forth in Table 2 below. Because the contact layer 5 and the active layer 3 are formed in the layer of silicon material 6, the materials set forth in Table 2 apply to both the contact layer 5 and the active layer 3.

TABLE 2

| Materials for the layer of silicon material 6 |
| --- |
| porous epitaxial silicon (Si) |
| porous polysilicon (Si) |
| porous amorphous silicon (Si) |
| porous silicon carbide (SiC) |

Materials for the porous epitaxial silicon (Si) of Table 2 include but are not limited to the porous epitaxial silicon (Si) materials set forth in Table 3 below.

TABLE 3

| Materials for the porous epitaxial silicon (Si) of the layer of silicon material 6 |
| --- |
| n− porous epitaxial silicon (Si) |
| p− porous epitaxial silicon (Si) |
| intrinsic porous epitaxial silicon (Si) |

Materials for the porous polysilicon (Si) of Table 2 include but are not limited to the porous polysilicon (Si) materials set forth in Table 4 below.

TABLE 4

| Materials for the porous polysilicon (Si) of the layer of silicon material 6 |
| --- |
| n− porous polysilicon (Si) |
| p− porous polysilicon (Si) |
| intrinsic porous polysilicon (Si) |

For the porous epitaxial silicon, the porous polysilicon, and the porous amorphous silicon of Table 2, the doped region 8 of the contact layer 5 can include a dopant material including but not limited to the dopant materials in Table 5 below.

For the porous silicon carbide (SiC) of Table 2, the doped region 8 of the contact layer 5 can include an n-type dopant material including but not limited to the dopant materials in rows 2, 4, and 5 of Table 5 below.

TABLE 5

| N-type Dopant Materials for the heavily doped region 8 of the contact layer 5 |
| --- |
| 1. Arsenic (As) |
| 2. Phosphorus (P) |
| 3. Antimony (Sb) |
| 4. Nitrogen (N) |
| 5. Vanadium (V) |

Figure 3:
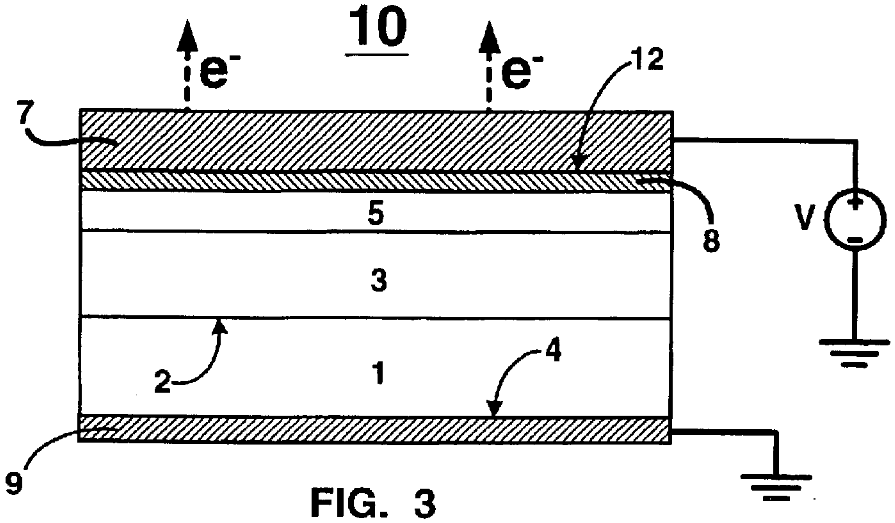
FIG. 3 is a cross-sectional view of the high emission electron emitter of FIG. 2*a* and further including an ohmic contact according to the present invention.

In one embodiment of the present invention, as illustrated in FIG. 3, the high emission electron emitter 10 includes an ohmic contact 9 that is in contact with the back-side surface 4 of the electron injection layer 1. Suitable materials for the ohmic contact 9 include but are not limited to gold (Au), a gold alloy, platinum (Pt), a platinum alloy, aluminum (Al), an aluminum alloy, and a multilayer of metal that includes but is not limited to tantalum on top of gold (Ta/Au) and chromium on top of gold (Cr/Au).

The ohmic contact 9 may be necessary for an electrochemically anodizing fabrication step in order to make a good electrical connection (i.e. an ohmic contact) with an electrode (e.g. a platinum (Pt) electrode) that the electron injection layer 1 is mounted to during the anodization process. If the electron injection layer 1 has a low resistivity of less than a few mΩ.cm, then the ohmic contact 9 may not be necessary. However, if the electron injection layer 1 has a high resistivity of more than a few Ω.cm, then the ohmic contact 9 may be necessary. Alternatively, if the electron injection layer 1 has a high resistivity, then the back-side 4 can be subjected to a high-dose ion implantation of phosphorus (P) for n-type material or boron (B) for p-type material to decrease the resistivity of the electron injection layer 1 so that a good electrical contact is made with the electrode during anodization.

Figure 4A:
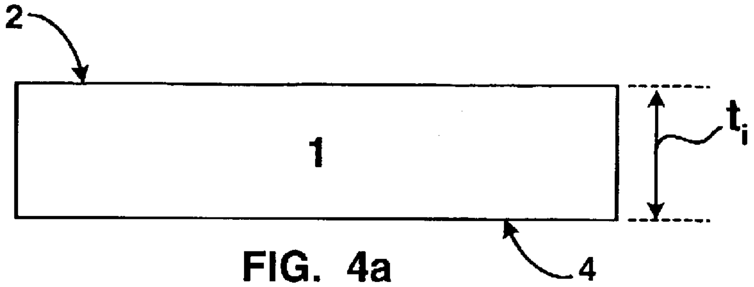
FIGS. 4*a* through 4*d* illustrate a method of fabricating a high emission electron emitter including an electron injection layer and a contact layer of low porosity porous silicon material that includes an n-type heavily doped region according to the present invention.

In FIGS. 4*a* through 4*d*, and FIGS. 5*a* through 5*c*, a method of fabricating a high emission electron emitter is illustrated. In FIG. 4*a*, an electron injection layer 1 includes a front-side surface 2 and a back-side surface 4. The electron injection layer 1 has a thickness $t_i$ measured between the front-side and back-side surfaces (2, 4). Materials for the electron injection layer 1 include but are not limited to those set forth in Table 1 above.

Figure 4B:
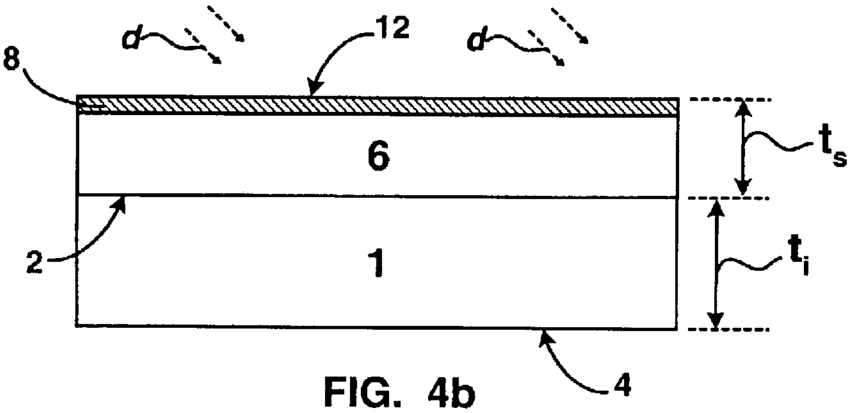

In FIG. 4*b*, a layer of silicon material 6 is deposited on the front-side surface 2 of the electron injection layer 1. The layer of silicon material 6 has a thickness $t_S$ measured between an interface surface 12 of the layer of silicon material 6 and the front-side 2. The interface surface 12 is doped during formation (i.e. insitu) or after formation (i.e. diffusion or ion implantation) of the layer of silicon material 6 to form a doped region 8 that extends inward of the interface surface 12. For instance, insitu formation and doping of the layer of silicon material 6 can be accomplished by a process such as chemical vapor deposition (CVD), wherein the layer of silicon material 6 is deposited via CVD and dopant gases such as phosphine ($PH_3$) or arsine ($AsH_3$) are introduced into the deposition chamber during the deposition.

On the other hand, the doped region 8 can be formed after depositing the layer of silicon material 6 by diffusion or by ion implantation. Annealing is required after the diffusion or the ion implantation. For example, an acceleration voltage of about 30.0 kV and a dose of about $1*10^{15}$ $cm^{-2}$ to about $1*10^{19}$ $cm^{-2}$ can be used for the ion implantation.

After doping, the layer of silicon material 6 is annealed in an inert ambient. Annealing time and temperature will depend on the application and on the type of dopant, the dose of the dopant, and the process used to effectuate the doping (e.g. ion implantation, diffusion, or insitu deposition).

For the dopant materials set forth in Table 5 above, the annealing time can include but is not limited to an annealing time of about 1.0 hours, the annealing temperature can include but is not limited to a temperature of about 1000 degrees centigrade, and the inert ambient can include but is not limited to a vacuum or an inert gas. For instance, the inert gas can be nitrogen (N) or argon (Ar). Preferably argon (Ar) is used for the inert ambient.

The materials for the layer of silicon material 6 include but are not limited to those set forth above in Tables 2, 3, and 4. Suitable dopant materials for the doped region 8 include but are not limited to those set forth in Table 5 above. The doping of the doped region 8 can be accomplished using a process including but not limited to ion implantation, diffusion, and insitu deposition.

Figure 4C:
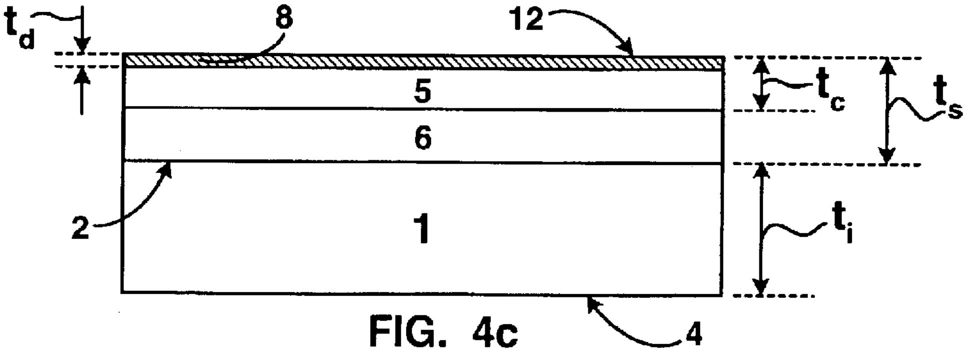

In FIG. 4*c*, the interface surface 12 of the layer of silicon material 6 is electrochemically anodized (as will be discussed below) to form a contact layer of low porosity porous silicon material 5 that extends inward of the interface surface 12 and has a thickness $t_c$ as measured from the interface surface 12.

Figure 4D:
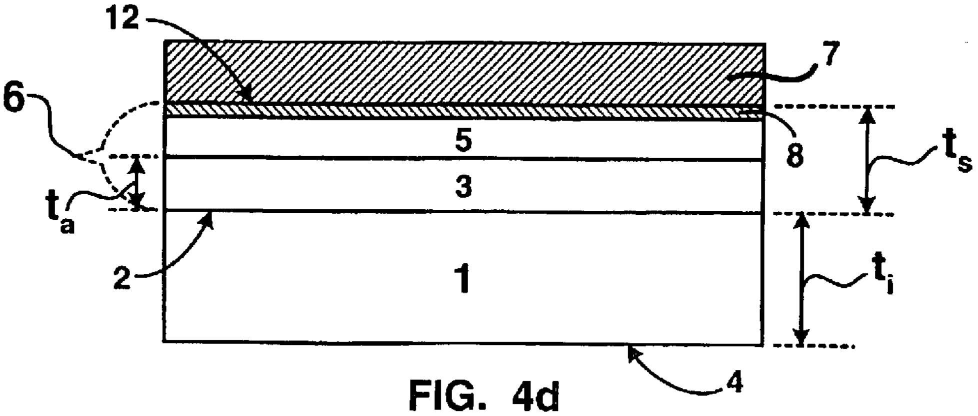

In FIG. 4*d*, the layer of silicon material 6 is continuously electrochemically anodized (as will be discussed below) to form an active layer of high porosity porous silicon material 3 that is in contact with the front-side surface 2 of the electron injection layer 1 and is positioned intermediate between the contact layer 5 and electron injection layer 1. The active layer 3 has a thickness $t_a$. As a result of the above electrochemical anodization steps, the layer of silicon material 6 (see dashed lines) is converted in to strata of porous silicon material of varying porosity. After the anodization, a top electrode 7 is deposited on the interface surface 12 of the contact layer 5. Materials for the top electrode 7 include those set forth above in reference to FIG. 2*b*.

Figure 5A:
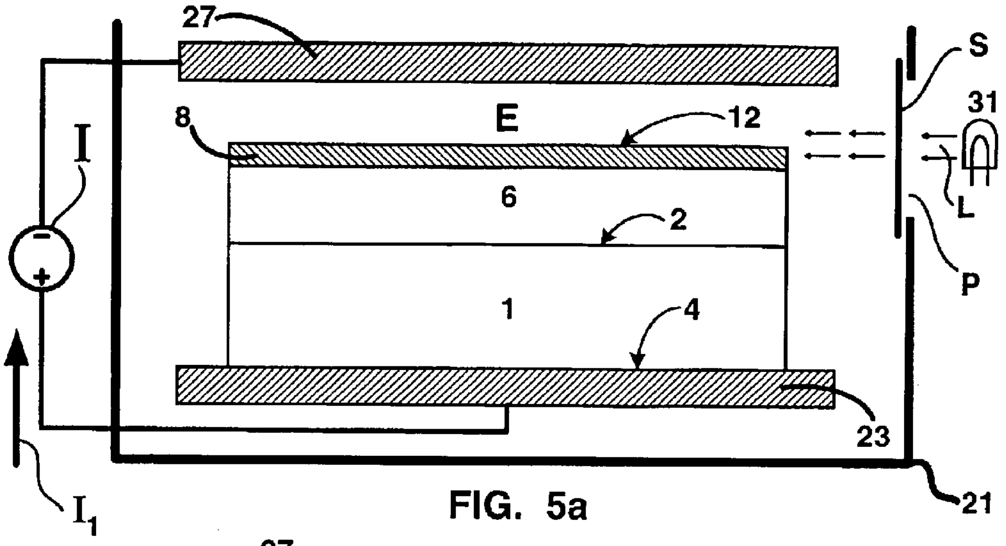
FIGS. 5*a* through 5*c* illustrate an electrochemical anodization method of fabricating a high emission electron emitter including an electron injection layer and a contact layer of low porosity porous silicon material that includes a n+ doped region according to the present invention.
Figure 5B:
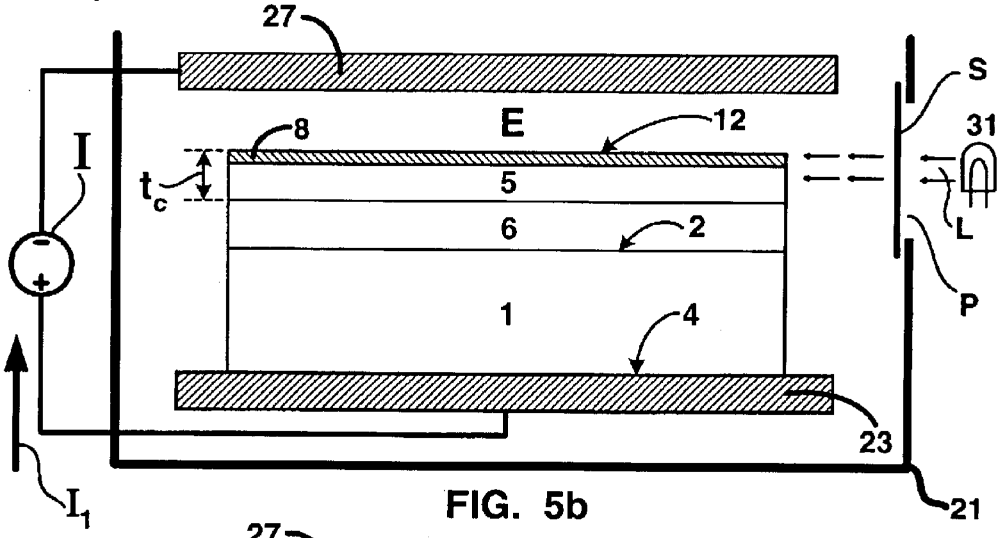
Figure 5C:
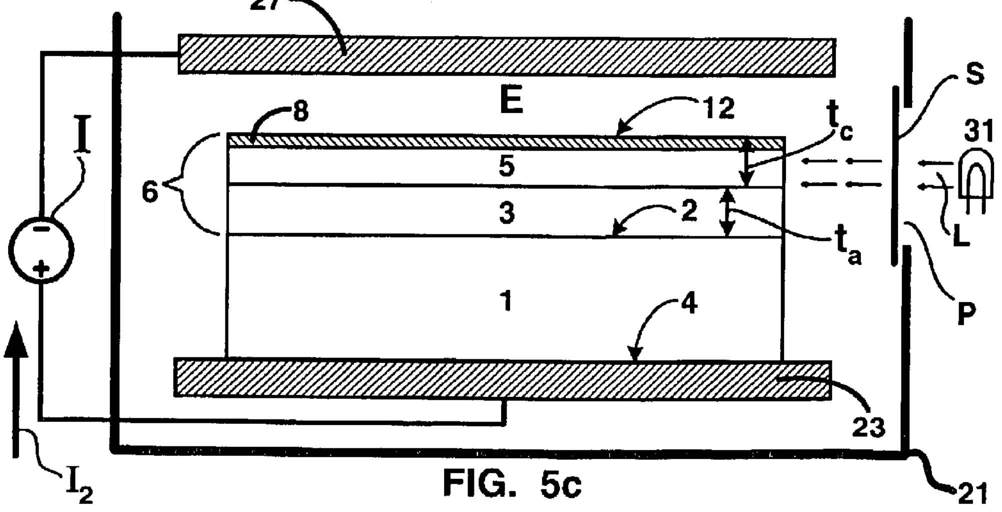

FIGS. 5*a* through 5*c* illustrate a process of electrochemically anodizing the layer of silicon material 6 to fabricate the high emission electron emitter 10 of the present invention. Prior to the electrochemical anodization, the ohmic contact 9 (see FIG. 3) can be deposited on the back-side surface 4 of the electron injection layer 1.

In FIG. 5*a*, the configuration illustrated in FIG. 4*b* (i.e. electron injection layer 1 plus the layer of silicon material 6 with the doped region 8) is placed in a chamber 21 that includes a first electrode 23 and a second electrode 27. The electron injection layer 1 is in electrical communication with the first electrode 23. Typically, the electron injection layer 1 is mounted to the first electrode 23. An electrically conductive metal is used for the first and second electrodes (23, 27). Preferably, platinum (Pt) is used for the first and second electrodes (23, 27) because platinum (Pt) is resistant to a hydrofluoric acid (HF) solution that will be used in the anodizing process.

During the electrochemical anodization, it is usually desirable to expose only the interface surface 12 to the hydrofluoric acid (HF) solution. To that end, a seal (not shown) can be used to prevent the HF solution from attacking the back-side surface 4 of the electron injection layer 1 and/or other portions of the electron injection layer 1 and the layer of silicon material 6. Essentially, the seal allows the HF solution to contact only the interface surface 12 and prevents the HF solution from coming into contact with other portions of the configuration illustrated in FIG. 4*b* including the back-side surface 4.

A current source I is connected with the first and second electrodes (23, 27) such that the first electrode 23 is an anode and the second electrode 27 is a cathode. The chamber 21 is filled with a hydrofluoric acid (HF) solution E that completely covers the interface surface 12 of the layer of silicon material 6 and the first and second electrodes (23, 27).

For the embodiments described herein, the concentration of the HF solution E can include but is not limited to the concentrations set forth in Table 6 below. Typically, the HF solution E is a dilute solution of hydrofluoric acid (HF) in water ($H_20$) and the dilute solution is added to ethanol ($C_2H_5OH$) to form an ethanoic solution having a predetermined wt % of HF. The concentration of HF in water ($H_20$), and/or ethanol ($C_2H_5OH$) can also be determined by volume. Preferably, the HF solution E has a concentration from about 10% by volume to about 30% by volume. The HF solution E can have a temperature of about 0° C. (that is, about zero degrees centigrade). However, the actual temperature of the HF solution E will be application dependent and is not limited to the ranges set forth herein.

TABLE 6

| Concentration of the HF solution E |
|---|
| about 10% by volume to about 30% by volume |
| hydrofluoric acid (HF) and water ($H_20$) in a ratio of about 1:1 |
| hydrofluoric acid (HF) and ethanol ($C_2H_5OH$) in a ratio of about 1:1 |
| about 50 wt % to about 60 wt % hydrofluoric acid (HF) and ethanol ($C_2H_5OH$) in a ratio of about 1:1 |
| hydrofluoric acid (HF), water ($H_20$), and ethanol ($C_2H_5OH$) in a ratio of about 1:1:2 |

In FIGS. 5*a* through 5*c*, the method of fabricating a high emission electron emitter includes, prior to the electrochemical anodization, depositing a layer of silicon material 6 on the front-side surface 2 of the electron injection layer 1 (see FIGS. 4*a* and 4*b*). After depositing the layer of silicon material 6, an interface surface 12 is defined on the layer of silicon material 6 and the layer of silicon material 6 has a thickness $t_s$. The interface surface 12 is doped with a dopant material prior to the electrochemical anodization so that a portion of the layer of silicon material 6 proximate to the interface surface 12 includes a doped region 8 as illustrated in FIG. 4*b*.

In FIG. 8*a*, the layer of silicon material 6 including the doped region 8, is placed in the chamber 21 as described above. In a dark ambient, a current source I passes a first anodization current density $I_1$ (in mA/cm$^2$) through the first and second electrodes (23, 27) and the HF solution E to electrochemically anodize the interface surface 12 of the layer of silicon material 6 to form a contact layer of low porosity porous silicon material 5 that extends inward of the interface surface 12.

The first anodization current density $I_1$ is maintained for a first period of time $T_1$ until the contact layer of low porosity porous silicon material 5 has a first thickness $t_c$ as illustrated in FIG. 5*b*.

In FIG. 5*c*, the current source I switches the anodization current density from the first anodization current density $I_1$ to a second anodization current density $I_2$ (in mA/cm$^2$) to form an active layer of high porosity porous silicon material 3. The active layer of high porosity porous silicon material 3 is formed by anodization in an optical ambient that is preselected based on the material for the layer of silicon 6. The active layer of high porosity porous silicon material 3 is positioned intermediate between the contact layer of low porosity porous silicon material 5 and the front-side surface 2 of the electron injection layer 1.

The second anodization current density $I_2$ is maintained for a second period of time $T_2$ until the active layer of high porosity porous silicon material 3 has a second thickness $t_a$. Because the electrochemical anodization process converts the layer of silicon material 6 into strata of porous silicon (PS) (i.e. the contact layer 5 and the active layer 3), the resulting active layer of high porosity porous silicon 3 is positioned intermediate between the contact layer of low porosity porous silicon material 5 and the front-side surface 2 of the electron injection layer 1 as illustrated in FIG. 5*c*.

Figure 6A:
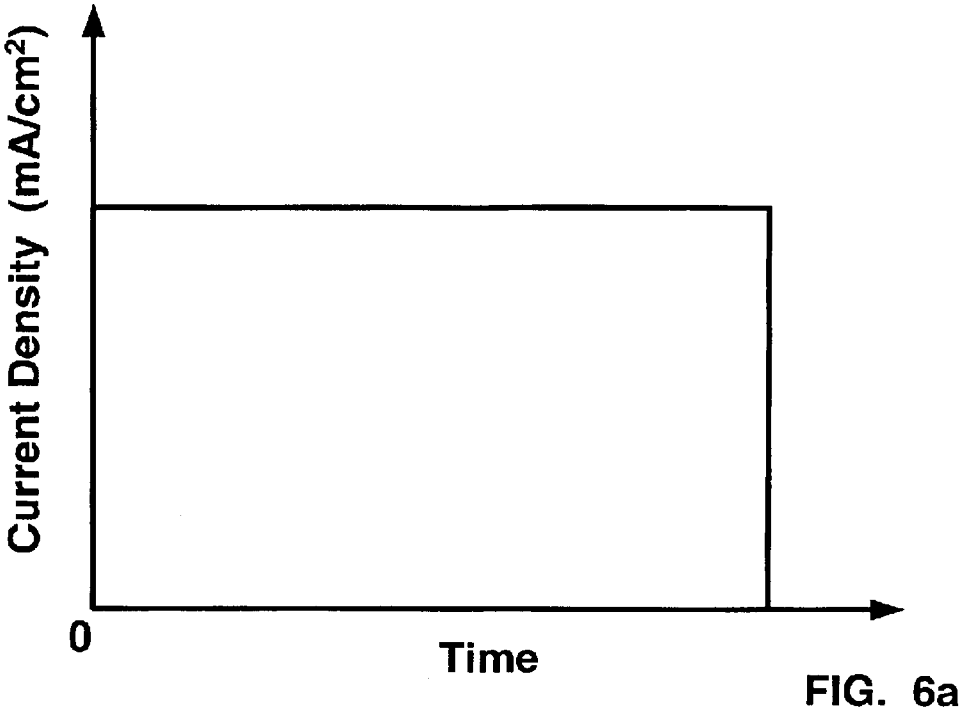
FIGS. 6*a* and 6*b* illustrate a constant anodization current density and a varying anodization current density respectively, according to the present invention.
Figure 6B:
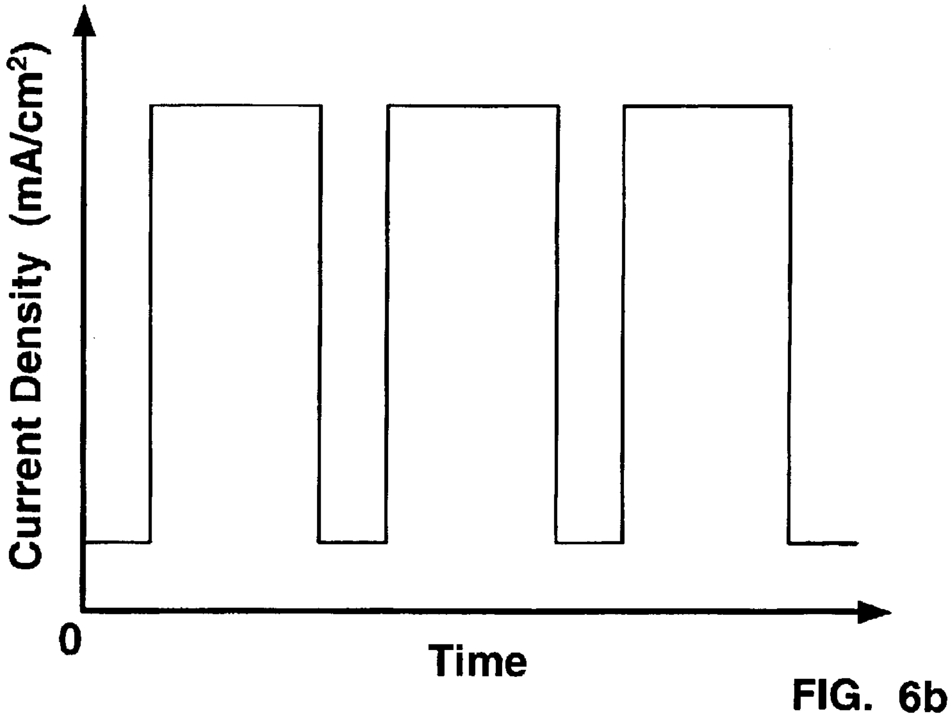

The second anodization current density $I_2$ can be greater than or equal to the first anodization current density $I_1$. Preferably, the second anodization current density $I_2$ is greater than the first anodization current density $I_1$. Moreover, either one or both of the first and second anodization current densities ($I_1$, $I_2$) can be a constant current density (i.e. constant amplitude over time) as illustrated in FIG. 6*a*, or they can be a varying current density (i.e. modulated amplitude over time) as illustrated in FIG. 6*b*. Although FIG. 6*b* illustrates a rectangular waveform, the waveform used for the varying current density is not limited to a rectangular waveform. Any suitable waveform can be used, for example, a triangular waveform or a stair-step wave form can be used.

The first thickness $t_c$ and the second thickness $t_a$ will vary depending on the application and on several fabrication related factors including: the first and second anodization times ($T_1$, $T_2$); the first and second anodization current densities ($I_1$, $I_2$); whether or not the anodization occurs in a dark ambient or an illuminated ambient; the type and wattage of the light source used to provide the illuminated ambient; the concentration of the HF solution E; and the temperature of the HF solution E.

Optionally, after the active layer of high porosity porous silicon material 3 is formed, an electrically conductive material is deposited on the contact layer 5 (i.e. on the interface surface 12) to form the top electrode 7 (not shown, see FIG. 4*d*). The materials for the top electrode 7 include those set forth above.

The preselected optical ambient for anodization of the active layer 3 is a dark ambient when the layer of silicon material is p− porous epitaxial silicon. In contrast, the preselected optical ambient is an illuminated ambient when the layer of silicon material is n− porous epitaxial silicon or intrinsic porous epitaxial silicon.

The preselected optical ambient for anodization of the active layer 3 is a dark ambient when the layer of silicon material 6 is p− porous polysilicon. Conversely, the preselected optical ambient is an illuminated ambient when the layer of silicon material is n− porous polysilicon or intrinsic porous polysilicon.

As illustrated in FIGS. 5*a* through 5*c*, the illuminated ambient can be provided by a light source 31 that is connected to a power supply (not shown). The light source 31 generates light L that enters the chamber 21 through a port P. The port P can be made from a HF resistant material. If the light L is guided from the side of the chamber 21, then the port P must contain an optically transparent window. For instance, the window can be a material such as sapphire. If the light L is from above, then the second electrode 27 can be an optically transparent mesh. When an illuminated ambient is required, a shutter S can be moved to a non-port blocking position so that the light L illuminates the layer of silicon material 6. Preferably, the light L substantially illuminates the entirety of the interface surface 12.

On the other hand, in FIGS. 5*a* through 5*c*, the dark ambient can be provided by placing the shutter S in a port blocking position so that light L does not enter the chamber 21 through the port P during the electrochemical anodization process.

The first thickness $t_c$ and the second thickness $t_a$ in the layer of silicon material 6 will vary depending on the application and on several fabrication related factors as set forth above. Additionally, the first thickness $t_c$ and the second thickness $t_a$ in the layer of silicon material 6 will also depend on the light source 31 and the intensity (wattage) of the light source 31. A light source such as a mercury (Hg) light source or a tungsten (W) light source can be used for the light source 31. The wattage of the light source 31 will vary depending on the application. For instance, an exemplary light source is a 500 watt tungsten light source. On the other hand, a 150 watt mercury light source can also be used. The wattage for the light source 31 is not limited to the ranges set forth herein and light sources other than mercury (Hg) or a tungsten (W) can be used.

In one embodiment of the present invention, the first anodization current density $I_1$ includes but is not limited to a range from about 2 $mA/cm^2$ to about 5 $mA/cm^2$.

In another embodiment of the present invention, the first period of time $T_1$ includes but is not limited to a range from about 3 seconds to about 30 seconds for the dark ambient.

In yet another embodiment of the present invention, the first thickness $t_c$ includes but is not limited to a range from about 4.0 nm to about 10.0 nm.

In one embodiment of the present invention, the second anodization current density $I_2$ includes but is not limited to a range from about 10 $mA/cm^2$ to about 50 $mA/cm^2$.

In another embodiment of the present invention, the second period of time $T_2$ includes but is not limited to a range from about 5 seconds to about 2 minutes. The second period of time $T_2$ will vary depending on whether or not the electrochemical anodization occurs in an illuminated ambient or in a dark ambient. Therefore, the second period of time $T_2$ should be varied appropriately depending on the type of optical ambient used (i.e. illuminated or dark). The anodization rate at a dark or an illuminated ambient may be different, but the second period of time $T_2$ depends on the desired thickness of the active layer 3 (i.e. $t_a$).

In yet another embodiment of the present invention, the second thickness $t_a$ includes but is not limited to a range from about 0.5 $\mu m$ to about 2.0 $\mu m$.

The porosity of the contact layer of low porosity porous silicon material 5 and the active layer of high porosity porous silicon material 3 can be a relative measure of an amount of air (free space) remaining in the contact layer 5 and the active layer 3 after the electrochemical anodization process. For instance, a porosity of 35% for the contact layer 5 would be 35% air and 65% silicon in weight and a porosity of 85% for the active layer 3 would be 85% air and 15% silicon in weight.

Accordingly, the contact layer of low porosity porous silicon material 5 has more silicon in weight remaining after the electrochemical anodization because its low porosity means that ratio of silicon to air is higher (i.e. more silicon remains than air). Conversely, the active layer of high porosity porous silicon material 3 has less silicon in weight remaining after the electrochemical anodization because its high porosity means that ratio of silicon to air is lower (i.e. more air remains than silicon).

The range of porosities for the contact layer of low porosity porous silicon material 5 and the active layer of high porosity porous silicon material 3 can vary and are highly dependent on several factors including the type of material (i.e. single crystal for the electron injection layer 1 and epitaxial or polysilicon for the layer of silicon material 6), the doping concentration and dopant type, the anodization current density, whether or not the anodization occurs in a dark or illuminated ambient, the concentration of the HF solution E, just to name a few.

Consequently, a low porosity for the contact layer 5 can vary over a wide range. For instance, the low porosity for the contact layer 5 can be in a range from about 10% to about 40%. That range is an example only and the porosity of the contact layer of low porosity porous silicon 5 is not limited to that range. In contrast, a high porosity for the active layer 3 can also vary over a wide range. For instance, the high porosity for the active layer 3 can be in a range from about 60% to about 85%. That range is an example only and the porosity of the active layer of high porosity porous silicon 3 is not limited to that range.

Because one objective of the contact layer of low porosity porous silicon material 5 of the present invention is intended to reduce the series contact resistance between the active layer of high porosity porous silicon material 3 and the top electrode 7, the contact layer of low porosity porous silicon 5 should be as thin and as compact as possible. Accordingly, it is important that the contact layer of low porosity porous silicon 5 be significantly thinner than the active layer of high porosity porous silicon 3 (i.e. $t_c<t_a$ because $t_c$ is nm thick versus $\mu m$ thick for $t_a$). The examples as set forth herein for the first period of time $T_1$, the concentration of the HF solution E, the first anodization current density $I_1$, and the optical ambient (dark or illuminated) are consistent with fabricating the contact layer of low porosity porous silicon 5 that is thin and compact, that reduces the series contact resistance, and having a low porosity relative to the high porosity of the active layer 3.

Although several embodiments of the present invention have been disclosed and illustrated, the invention is not limited to the specific forms or arrangements of parts so described and illustrated. The invention is only limited by the claims.

What is claimed is:

1. A method of fabricating a high emission electron emitter that includes an electron injection layer with a layer of silicon material thereon, the layer of silicon material including an active layer of high porosity porous silicon material, and a contact layer of low porosity porous silicon material, comprising:

doping an interface surface of the layer of silicon material with a dopant to form an n-type heavily doped region that extends inward of the interface surface and extends only partially into the layer of silicon material;

anodizing the interface surface in a hydrofluoric acid solution in a preselected optical ambient at a first anodization current density to form the contact layer of low porosity porous silicon material therein;

maintaining the first anodization current density for a first period of time until the contact layer of low porosity porous silicon material has a first thickness;

switching the first anodization current density to a second anodization current density to form the active layer of high porosity porous silicon material; and maintaining the second anodization current density for a second period of time until the active layer of high porosity porous silicon material has a second thickness.

2. The method as set forth in claim 1, wherein the doping step is a process selected from the group consisting of an ion implantation, a diffusion, and an insitu deposition.

3. The method as set forth in claim 2 and further comprising after the doping step:

annealing the layer of silicon material in an inert ambient if the doping process is the ion implantation or the diffusion.

4. The method as set forth in claim 1, wherein the first anodization current density and the second anodization current density is a selected one of a constant current density and a time varying current density.

5. The method as set forth in claim 1, wherein the second anodization current density is greater than or equal to the first anodization current density.

6. The method as set forth in claim 1, wherein the inert ambient is an ambient selected from the group consisting of a vacuum, an inert gas, argon gas, and nitrogen gas.

7. The method as set forth in claim 1, wherein the first anodization current density is from about 2 $mA/cm^2$ to about 5 $mA/cm^2$.

8. The method as set forth in claim 1, wherein the first thickness is from about 5 nm to about 10 nm.

9. The method as set forth in claim 1, wherein the second anodization current density is from about 10 $mA/cm^2$ to about 50 $mA/cm^2$.

10. The method as set forth in claim 1, wherein the second period of time is from about 5 seconds to about 2 minutes.

11. The method as set forth in claim 1, wherein the second thickness is from about 0.5 $\mu$m to about 2.0 $\mu$m.

12. The method as set forth in claim 1, wherein the electron injection layer comprises an electrically conductive material selected from the group consisting of a n+ semiconductor, n+ single crystal silicon, an electrically conductive silicide, an electrically conductive nitride, a metal, and a layer of metal on a glass substrate.

13. The method as set forth in claim 12, wherein the n+ single crystal silicon includes a crystalline orientation selected from the group consisting of a 100 crystalline orientation and a 111 crystalline orientation.

14. The method as set forth in claim 12, wherein the silicide is selected from the group consisting of a titanium silicide and a platinum silicide, and the electrically conductive nitride comprises a titanium nitride.

15. The method as set forth in claim 1, wherein the contact layer of low porosity porous silicon material and the active layer of high porosity porous silicon material are a material selected from the group consisting of porous epitaxial silicon, porous polysilicon, porous amorphous silicon, and porous silicon carbide.

16. The method as set forth in claim 15, wherein the porous epitaxial silicon is a material selected from the group consisting of n− porous epitaxial silicon, p− porous epitaxial silicon, and intrinsic porous epitaxial silicon.

17. The method as set forth in claim 16, wherein for the n− porous epitaxial silicon and the intrinsic porous epitaxial silicon, the doped region of the contact layer includes a dopant material selected from the group consisting of arsenic, phosphorus, and antimony.

18. The method as set forth in claim 16, wherein the preselected optical ambient is a dark ambient when the layer of silicon material is p− porous epitaxial silicon, and wherein the preselected optical ambient is an illuminated ambient when the layer of silicon material is n− porous epitaxial silicon or intrinsic porous epitaxial silicon.

19. The method as set forth in claim 18, wherein the first period of time is from about 3 seconds to about 30 seconds.

20. The method as set forth in claim 15, wherein the porous polysilicon is a material selected from the group consisting of n− porous polysilicon, p− porous polysilicon, and intrinsic, porous polysilicon.

21. The method as set forth in claim 20, wherein for the n− porous polysilicon and the intrinsic porous polysilicon, the doped region of the contact layer includes a dopant material selected from the group consisting of arsenic, phosphorus, and antimony.

22. The method as set forth in claim 20, wherein the preselected optical ambient is a dark ambient when the layer of silicon material is p− porous polysilicon, and wherein the preselected optical ambient is an illuminated ambient when the layer of silicon material is n− porous polysilicon or intrinsic porous polysilicon.

23. The method as set forth in claim 22, wherein the first period of time is from about 3 seconds to about 30 seconds.

24. The method as set forth in claim 15, wherein for the porous silicon carbide, the doped region of the contact layer includes a dopant material selected from the group consisting of nitrogen, phosphorus, and vanadium.

25. The method as set forth in claim 1 and further comprising:

after the second period of time, depositing an electrically conductive material on the interface surface to form a top electrode thereon.

* * * * *